US008513356B1

(12) United States Patent
Sharma et al.

(10) Patent No.: US 8,513,356 B1
(45) Date of Patent: Aug. 20, 2013

(54) DIBLOCK COPOLYMER BLEND COMPOSITION

(75) Inventors: Rahul Sharma, Lake Jackson, TX (US); Valeriy V. Ginzburg, Midland, MI (US); Phillip D. Hustad, Manvel, TX (US); Jeffrey D. Weinhold, Lake Jackson, TX (US)

(73) Assignee: Dow Global Technologies LLC, Midland, MI (US)

( * ) Notice: Subject to any disclaimer, the term of this patent is extended or adjusted under 35 U.S.C. 154(b) by 77 days.

(21) Appl. No.: 13/370,571

(22) Filed: Feb. 10, 2012

(51) Int. Cl.
*C08L 53/00* (2006.01)

(52) U.S. Cl.
USPC ........... 525/89; 525/88; 525/228; 525/309; 427/385.5; 428/826; 428/339; 216/55

(58) Field of Classification Search
USPC ............. 525/88, 89, 228, 309; 427/385.5; 428/826, 339; 216/55
See application file for complete search history.

(56) References Cited

U.S. PATENT DOCUMENTS

| | | | |
|---|---|---|---|
| 6,926,953 | B2 | 8/2005 | Nealey et al. |
| 7,763,319 | B2 | 7/2010 | Cheng et al. |
| 2006/0134556 | A1 | 6/2006 | Nealey et al. |
| 2008/0233435 | A1* | 9/2008 | Hasegawa et al. ........... 428/826 |
| 2008/0299353 | A1 | 12/2008 | Stoykovich et al. |
| 2009/0087664 | A1 | 4/2009 | Nealey et al. |
| 2009/0092803 | A1 | 4/2009 | Bita et al. |
| 2009/0181171 | A1 | 7/2009 | Cheng et al. |
| 2009/0260750 | A1 | 10/2009 | Nealey et al. |
| 2009/0305173 | A1 | 12/2009 | Xiao et al. |
| 2011/0097559 | A1 | 4/2011 | Hawker et al. |

OTHER PUBLICATIONS

Chen, et al., Alignment of Cylindrical Microdomains on a Grating Substrate by Binary Blends of Polystyrene-Poly (methyl methacrylate), Journal of Photopolymer Science and Technology, vol. 20, No. 4, pp. 505-510 (2007).
Zhao, et al., Saxs Analysis of the Order-Disorder Transition and the Interaction Parameter of Polystyrene-block-poly (methyl methacrylate), Macromolecules, vol. 41, pp. 9948-9951 (2008).
Matsen, et al., Unifying Weak- and Strong-Segregation Block Copolymer Theories, Macromolecules, vol. 29, No. 4, pp. 1091-1098 (1996).
Ginzburg, et al., Theoretical Modeling of the Relationship Between Young's Modulus and Formulation Variables for Segmented Polyurethanes, Journal of Polymer Science: Part B: Polymer Physics, vol. 45, pp. 2123-2135 (2007).
Han, et al., Perpendicular Orientation of Domains in Cylinder-Forming Block Copolymer Thick Films by Controlled Interfacial Interactions, Macromolecules, vol. 42, No. 13, pp. 4896-4901 (2009).
Ahn, et al., Fabrication of well-defined block copolymer nano-cylinders by controlling the thermodynamics and kinetics involved in block copolymer self-assembly, Soft Matter, The Royal Society of Chemistry, vol. 4, pp. 1454-1466 (2008).
Kim, et al., Solvent-Induced Ordering in Thin Film Diblock Copolymer/Homopolymer Mixtures, Advanced Materials, vol. 16, No. 23-24, pp. 2119-2123 (2004).
Park, et al., Highly Ordered Nanoporous Thin Films by Blending of PSt-b-PMMA Block Copolymers and PEO Additives as Structure Directing Agents, Journal of Polymer Science: Part A: Polymer Chemistry, vol. 46, issue 24, pp. 8041-8048 (2008).

* cited by examiner

*Primary Examiner* — Mark Kaucher
(74) *Attorney, Agent, or Firm* — Thomas S. Deibert

(57) ABSTRACT

A diblock copolymer blend containing a unique combination of an ordered poly(styrene)-b-poly(methyl methacrylate) diblock copolymer and a disordered poly(styrene)-b-poly(methyl methacrylate) diblock copolymer is provided. Also provided are substrates treated with the diblock copolymer blend.

10 Claims, 3 Drawing Sheets

DIBLOCK COPOLYMER BLEND COMPOSITION

The present invention relates to the field of self assembling diblock copolymers. In particular, the present invention is directed to a specific blend of an ordered poly(styrene)-b-poly(methyl methacrylate) diblock copolymer and a disordered poly(styrene)-b-poly(methyl methacrylate) diblock copolymer; and to methods of using the same.

Thin films derived from asymmetric diblock copolymers having regularly spaced pores have found utility in a variety of applications including, for example, in the manufacture of ultra filtration membranes, microelectronic devices and imprint masters. Certain asymmetric diblock copolymers have the ability to self assemble to form domains of the minority block material within the majority block material. It is desirable in many of these applications to have a material in which the minority block material self assembles to form cylindrical holes oriented with an axis of symmetry perpendicular to the surface of the substrate on which the film is formed. It is very difficult using conventional materials to ensure complete perpendicular orientation of the minority block material during formation of such films to facilitate the subsequent formation of the desired perpendicular, cylindrical holes. The film thickness and annealing conditions often need to be monitored and controlled very precisely to stabilize the desired perpendicular orientation of the minority block material during formation of the film over large areas across the film. As a result, the processing window associated with conventional diblock materials is severely restricted. The best perpendicular, cylindrical hole orientation for films prepared using conventional diblock materials is typically achieved when the film thickness is about 0.9 times the equilibrium inter cylinder spacing, $L_O$, for the minority block material.

One particularly interesting application for such self assembling materials is in the miniaturization of microelectronic devices. These self assembling materials have the potential to function similarly to photoresists to facilitate pattern formation in semiconductor manufacture. In such processes; however, wherein the diblock material is being used as a resist, a film having a thickness of only 0.9 times the equilibrium inter cylinder spacing is typically inadequate to provide the necessary etch resistance to facilitate the desired pattern transfer to the substrate.

Chen, et al.[1] investigated the use of a blend of two poly (styrene)-b-poly(methyl methacrylate) diblock copolymers for making thin films having perpendicular oriented cylindrical domains. Specifically, Chen, et al. disclosed a blend containing 80 wt % of a first poly(styrene)-b-poly(methyl methacrylate) diblock copolymer having a molecular weight of 47.7 kg/mol, a polydispersity of 1.04, and a poly(methyl methacrylate) weight fraction of 25.6 wt %; and, 20 wt % of a second ordered poly(styrene)-b-poly(methyl methacrylate) diblock copolymer having a molecular weight of 67.2 kg/mol, a polydispersity of 1.09, and a poly(methyl methacrylate) weight fraction of 31.5 wt %. One of ordinary skill in the art would recognize that the first Chen diblock copolymer would have an associated $\chi N$ of 16.6 (at 225° C.) and the second Chen diblock copolymer would have an associated $\chi N$ of 22.3 (at 225° C.).

[1] Chen et al, *Alignment of Cylindrical Microdomains on a Grating Substrate by Binary Blends of Polystyrene-Poly(methyl methacrylate)*, JOURNAL OF PHOTOPOLYMER SCIENCE AND TECHNOLOGY, vol. 20, no. 4, pp. 505-10 (2007).

Nealey et al., disclose another blend of two poly(styrene)-b-poly(methyl methacrylate) diblock copolymers in United States Patent Application Publication No. 2006/0134556. Specifically, Nealey et al. disclose the use of a blend of a first ordered poly(styrene)-b-poly(methyl methacrylate) diblock copolymer having a bulk lamellar period of $L_{01}$ and a second ordered poly(styrene)-b-poly(methyl methacrylate) diblock copolymer having a bulk lamellar period $L_{02}$.

Notwithstanding, there remains a need for a diblock copolymer composition that exhibit a high affinity for the cylindrical poly(methyl methacrylate) domains to self assemble to orient themselves with their axes of symmetry perpendicular to the surface of the substrate when the diblock copolymer composition is applied to a substrate at a thickness within an enhanced range of film thicknesses (e.g., 0.5 $L_O$ to 2 $L_O$, wherein $L_O$ is the equilibrium inter cylinder spacing for the composition).

The present invention provides a diblock copolymer blend, comprising: >50 wt % to 99 wt % (on a solids basis) of an ordered poly(styrene)-b-poly(methyl methacrylate) diblock copolymer, BCP1, having a polystyrene volume fraction, $Vf_{BCP1-PS}$, of 0.65 to 0.87; and, wherein the following expression is true $$\chi N_{BCP1} > \left[ \frac{1.6}{Vf_{BCP1-PS} * (1 - VF_{BCP1-PS}) - 0.098} \right]$$

wherein $\chi N_{BCP1}$ is the product of the Flory-Huggins interaction parameter, $\chi_{BCP1}$, of BCP1 at 225° C. and the degree of polymerization, $N_{BCP1}$, of BCP1; and, 1 to <50 wt % (on a solids basis) of a disordered poly(styrene)-b-poly(methyl methacrylate) diblock copolymer, BCP2, having a polystyrene volume fraction, $Vf_{BCP2-PS}$, of 0.5 to 0.99; and, wherein the following expression is true $$\chi N_{BCP2} < \left[ \frac{2.6}{Vf_{BCP2-PS} * (1 - VF_{BCP2-PS})} \right]$$

wherein $\chi N_{BCP2}$ is the product of the Flory-Huggins interaction parameter, $\chi_{BCP2}$, of BCP2 at 225° C. and the degree of polymerization, $N_{BCP2}$, of BCP2; wherein the number average molecular weight of BCP1, $M_{N-BCP1}$, is 30 to 500 kg/mol; wherein the number average molecular weight of BCP2, $M_{N-BCP2}$ is 0.1 to <500 kg/mol; and, wherein $M_{N-BCP1}$ > $M_{N-BCP2}$.

The present invention provides a method comprising: providing a substrate having a surface; providing a diblock copolymer blend of the present invention; applying a film of the diblock copolymer blend to the surface of the substrate; optionally, baking the film; annealing the film; treating the annealed film to remove the poly(methyl methacrylate), providing a product film with a plurality of perpendicular, cylindrical holes; wherein each of the perpendicular, cylindrical holes exhibit an axis of symmetry that is perpendicular to the surface of the substrate.

The present invention provides a method comprising: providing a substrate having a surface; providing a diblock copolymer blend of the present invention; applying a film of the diblock copolymer blend to the surface of the substrate; optionally, baking the film; annealing the film; treating the annealed film to remove the poly(methyl methacrylate), providing a product film with a plurality of perpendicular, cylindrical holes; wherein each of the perpendicular, cylindrical holes exhibit an axis of symmetry that is perpendicular to the surface of the substrate; and, wherein the product film exhibits a degree of perpendicular, cylindrical hole orientation, $D_{perp}$, of ≧0.95 to 1.

DETAILED DESCRIPTION

Figure 1:
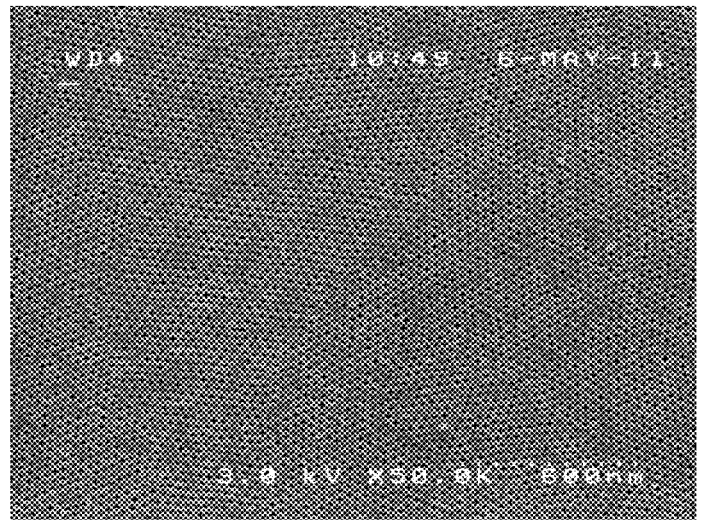
FIG. 1 is a depiction of a top down scanning electron microscopic ("SEM") image of the product film prepared according to Example 10.

The diblock copolymer blend of the present invention exhibit a high affinity for the perpendicular alignment of the poly(methyl methacrylate) domains in the ordered poly(styrene)-b-poly(methyl methacrylate) diblock copolymer when applied on a substrate over a broad range of deposited film thicknesses for the diblock copolymer blend (e.g., 0.5 $L_0$ to 2 $L_0$, wherein $L_0$ is the equilibrium inter cylinder spacing (or "Pitch") for the minority block material in the ordered poly(styrene)-b-poly(methyl methacrylate) diblock copolymer). Accordingly, the diblock copolymer blend of the present invention ensures the formation of a perpendicular alignment morphology over a broad range of film thicknesses, providing an enhanced process window with regards to variations in the deposited film thickness on a substrate. This is important for many applications given that some film thickness variation in the coating of a substrate is inevitable across various locations from the center to the edge of the substrate, or form one substrate to the next, or from tool to tool, or even from day to day resulting from variations in the environmental conditions. Hence, the enhanced process window facilitated by the present invention can be expected to result in significantly higher product device yields, providing significant commercial value.

The term "PS-b-PMMA diblock copolymer" used herein and in the appended claims is short hand for poly(styrene)-block-poly(methyl methacrylate) diblock copolymer.

The term "$M_{N-BCP}$" used herein and in the appended claims in reference to a PS-b-PMMA diblock copolymer of the present invention is the number average molecular weight of the PS-b-PMMA diblock copolymer (in g/mol) determined according to the method used herein in the Examples.

The term "$M_{W-BCP}$" used herein and in the appended claims in reference to a PS-b-PMMA diblock copolymer of the present invention is the weight average molecular weight of the PS-b-PMMA diblock copolymer (in g/mol) determined according to the method used herein in the Examples.

The term "$PD_{BCP}$" used herein and in the appended claims in reference to a PS-b-PMMA diblock copolymer of the present invention is the polydispersity of the PS-b-PMMA diblock copolymer determined according to the following equation:

$$PD_{BCP} = \frac{M_{W-BCP}}{M_{N-BCP}}.$$

The term "$FW_s$" used herein and in the appended claims is the formula weight for styrene, 104 g/mol.

The term "$FW_{MMA}$" used herein and in the appended claims is the formula weight for methyl methacrylate, 100 g/mol.

The term "$Wf_{BCP-PS}$" used herein and in the appended claims in reference to a PS-b-PMMA diblock copolymer of the present invention is the weight percent of the poly(styrene) block in the PS-b-PMMA diblock copolymer.

The term "$Wf_{BCP-PMMA}$" used herein and in the appended claims in reference to a PS-b-PMMA diblock copolymer of the present invention is the weight percent of the poly(methyl methacrylate) block in the PS-b-PMMA diblock copolymer.

The term "$d_{PS}$" used herein and in the appended claims is the density of poly(styrene), 1.05 g/cm³.

The term "$d_{PMMA}$" used herein and in the appended claims is the density of poly(methyl methacrylate), 1.18 g/cm³.

The term "$d_{BCP}$" used herein and in the appended claims in reference to a PS-b-PMMA diblock copolymer of the present invention is the density of the PS-b-PMMA diblock copolymer according to the following equation:

$$d_{BCP} = \frac{d_{PS} \times d_{PMMA}}{((d_{PMMA} \times Wf_{PS}) + (d_{PS} \times Wf_{PMMA}))}.$$

The term "$Vf_{PS}$" used herein and in the appended claims in reference to a PS-b-PMMA diblock copolymer of the present invention is the volume fraction of the poly(styrene) block in the PS-b-PMMA diblock copolymer according to the following equation:

$$Vf_{PS} = \left[\frac{(Wf_{PS} \times d_{BCP})}{d_{PS}}\right].$$

The term "$Vf_{PMMA}$" used herein and in the appended claims in reference to a PS-b-PMMA diblock copolymer of the present invention is the volume fraction of the poly(methyl methacrylate) block in the PS-b-PMMA diblock copolymer according to the following equation:

$$Vf_{PMMA} = \left[\frac{(Wf_{PMMA} \times d_{BCP})}{d_{PMMA}}\right].$$

The term "$\chi_{BCP}$" used herein and in the appended claims in reference to a PS-b-PMMA diblock copolymer of the present invention is the Flory-Huggins interaction parameter for the PS-b-PMMA diblock copolymer at temperature, T, in Kelvin according to the following equation[2]:

$$\chi_{BCP} = \left[0.0282 + \left(\frac{4.46}{T}\right)\right].$$

[2] Zhao, et al., *SAXS Analysis of the Order-Disorder Transition and the Interaction Parameter of Polystyrene-block-poly(methyl methacrylate)*, MACROMOLECULES, vol. 41, pp. 9948-51 (2008).

The term "$N_{BCP}$" used herein and in the appended claims in reference to a PS-b-PMMA diblock copolymer of the present invention is the degree of polymerization of the PS-b-PMMA diblock copolymer according to the following equation:

$$N_{BCP} = \left[\frac{(Wf_{BCP-PS} \times M_{N-BCP})}{FW_S}\right] + \left[\frac{(1 - Wf_{BCP-PS}) \times M_{N-BCP}}{FW_{MMA}}\right].$$

The term "$\chi_{BCP}$" used herein and in the appended claims in reference to a PS-b-PMMA diblock copolymer of the present invention is the mathematical product of $\chi_{BCP}$ and $N_{BCP}$ according to the following equation:

$$\chi N_{BCP} = \chi_{BCP} \times N_{BCP}.$$

Block copolymers are polymers that are synthesized from two or more different monomers and exhibit two or more polymeric chain segments that are chemically different, but yet, are covalently bound to one another. Diblock copolymers are a special class of block copolymers derived from two different monomers (e.g., A and B) and having a structure comprising a polymeric block of A residues covalently bound to a polymeric block of B residues (e.g., AAAAA-BBBBB).

The diblock copolymer blend of the present invention preferably comprises (consists essential of) (consists of): >50 wt % to 99 wt % (preferably 70 to 90 wt %; more preferably 75 to 85 wt %) (on a solids basis) of an ordered PS-b-PMMA diblock copolymer, BCP1, having a polystyrene volume fraction, $Vf_{BCP1-PS}$, of 0.65 to 0.87 (preferably 0.65 to 0.8, more preferably 0.7 to 0.8; most preferably 0.7 to 0.75); and, wherein the following expression[3] is true $$\chi N_{BCP1} > \left[\frac{1.6}{Vf_{BCP1-PS} * (1 - VF_{BCP1-PS}) - 0.098}\right]$$

wherein $\chi N_{BCP1}$ is the product of the Flory-Huggins interaction parameter, $\chi_{BCP1}$, of BCP1 at 225° C. and the degree of polymerization, $N_{BCP1}$, of BCP1 (preferably wherein $\chi N_{BCP1}$ is 20 to 100, more preferably 20 to 40, most preferably 25 to 35); and, 1 to <50 wt % (preferably 10 to 30 wt %; more preferably 15 to 25 wt %) (on a solids basis) of a disordered PS-b-PMMA diblock copolymer, BCP2, having a polystyrene volume fraction, $Vf_{BCP2-PS}$, of 0.5 to 0.99 (preferably 0.6 to 0.8; more preferably 0.6 to 0.7; most preferably 0.6 to 0.65); and, wherein the following expression[4] is true $$\chi N_{BCP2} < \left[\frac{2.6}{Vf_{BCP2-PS} * (1 - VF_{BCP2-PS})}\right]$$

wherein $\chi N_{BCP2}$ is the product of the Flory-Huggins interaction parameter, $\chi_{BCP2}$, of BCP2 at 225° C. and the degree of polymerization, $\chi N_{BCP2}$, of BCP2 (preferably wherein $\chi N_{BCP1}$ is <15; more preferably >0 to 10; most preferably 5 to 7); wherein the number average molecular weight of BCP1, $M_{N-BCP1}$, is 30 to 500 kg/mol (preferably 50 to 100 kg/mol; more preferably 70 to 80 kg/mol); wherein the number average molecular weight of BCP2, $M_{N-BCP2}$ is 0.1 to <500 kg/mol (preferably 1 to 50 kg/mol; more preferably 25 to 50 kg/mol); and, wherein $M_{N-BCP1} > M_{N-BCP2}$ (preferably $M_{W-BCP1} > 2 * M_{W-BCP2}$).

[3] The expression was derived from self consistent mean field theory corresponding to the range of poly(styrene) volume fractions from 0.65 to 0.87. See, e.g., Matsen, et al., *Unifying Weak- and Strong-Segregation Block Copolymer Theories*, MACROMOLECULES, vol. 29, no. 4, pp. 1091-1098 (1996); Ginzburg, et al., *Theoretical Modeling of the Relationship Between Young's Modulus and Formulation Variables for Segmented Polyurethanes*, JOURNAL OF POLYMER SCIENCE: PART B: POLYMER PHYSICS, vol. 45, pp. 2123-2135 (2007).

[4] The expression was derived from self consistent mean field theory corresponding to the range of poly(styrene) volume fractions from 0.5 to 0.99. See, e.g., references cited in FOOTNOTE 3.

Preferably, the ordered PS-b-PMMA diblock copolymers used in the diblock copolymer blend of the present invention exhibit a polydispersity, $PD_{BCP1}$, of 1 to 2 (preferably 1 to 1.5; more preferably 1 to 1.2).

Preferably, the disordered PS-b-PMMA diblock copolymers used in the diblock copolymer blend of the present invention exhibit a polydispersity, $PD_{BCP2}$, of 1 to 2 (preferably 1 to 1.5; more preferably 1 to 1.2).

Preferably, the volume fraction of the poly(styrene) block in the ordered PS-b-PMMA diblock copolymer, $Vf_{BCP1-PS}$, and the volume fraction of the poly(styrene) block in the disordered PS-b-PMMA diblock copolymer, $Vf_{BCP2-PS}$, used in the diblock copolymer blend of the present invention are within 20% of one another such that the following equation is satisfied:

$$0.20 \geq \left|\frac{Vf_{BCP1-PS} - Vf_{BCP2-PS}}{Vf_{BCP1-PS}}\right|.$$

More preferably, the poly(styrene) block volume fractions of the ordered PS-b-PMMA diblock copolymer, $Vf_{BCP1-PS}$, and of the disordered PS-b-PMMA diblock copolymer, $Vf_{BCP2-PS}$, used in the diblock copolymer blend of the present invention are within 0.001 to 20% (still more preferably 0.01 to 20%; most preferably 0.05 to 0.12%) of one another.

The diblock copolymer blend of the present invention optionally further comprises a solvent. Solvents suitable for use in the diblock copolymer blend of the present invention include liquids that are able to disperse the PS-b-PMMA diblock copolymers in the diblock copolymer blend into particles or aggregates having an average hydrodynamic diameter of less than 50 nm as measured by dynamic light scattering. Preferably, the solvent used is selected from propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene. More preferably, the solvent used is selected from propylene glycol monomethyl ether acetate (PGMEA) and toluene. Most preferably, the solvent used is toluene.

The diblock copolymer blend of the present invention optionally further comprises an additive. Additives suitable for use in the diblock copolymer blend of the present invention include, for example, additional polymers (including homopolymers and random copolymers); surfactants; antioxidants; photoacid generators; thermal acid generators; quenchers; hardeners; adhesion promoters; dissolution rate modifiers; photocuring agents; photosensitizers; acid amplifiers; plasticizers; orientation control agents; and cross linking agents. Preferred additives for use in the diblock copolymer blend include surfactants and antioxidants.

Orientation control agents are components that when added to the diblock copolymer blend segregate from the poly(styrene)-b-poly(methyl methacrylate) diblock copolymers upon application to a substrate such that a two layer film stack is formed on the substrate. In this two layer film stack, the orientation control agent segregates to form a first film layer and the poly(styrene)-b-poly(methyl methacrylate) diblock copolymers segregate to form a second film layer, wherein the first film layer is interposed between the surface of the substrate and the second film layer. Preferably, the orientation control agents that segregate to form the first film layer operate to direct the assembly of the poly(styrene) and the poly(methyl methacrylate) domains in the second film layer. The incorporation of orientation control agents into the diblock copolymer blend make it possible to form an orientation control layer on the substrate, without the need to perform the additional processing step of applying a dedicated orientation control layer onto the surface of the substrate. Orientation control agents include, for example, polymers having at least one oxirane group that can be crosslinked through the application of heat and/or a catalyst. The oxirane containing polymer is desirably the polymerization product of an oxirane containing monomer, but can be any oxirane modified polymer or resin that exhibits the desired film forming, phase segregation, surface adhesion, and microphase orienting properties. Preferred oxirane containing monomers also have a radically polymerizable carbon-carbon double bond, for example, $C_{3-30}$ epoxy containing (meth)acrylate monomers and $C_{4-30}$ epoxy containing olefinic monomers (such as epoxydicyclopentadiene methacrylate and glycidyl methacrylate. Exemplary orientation control materials include polymers comprising a hydroxyl group, such as hydroxyl terminated polymers (e.g., hydroxyl terminated poly(styrene-co-methyl methacrylate and blends of hydroxyl terminated poly(styrene), hydroxyl terminated poly(methyl methacrylate), and poly(styrene-b-methyl methacrylate)); and, hydroxyl functionalized polymers (e.g., poly(styrene-co-methyl methacrylate-co-2-hydroxyethyl methacrylate)).

The method of the present invention preferably comprises: providing a substrate; providing a diblock copolymer blend of the present invention; applying a film of the diblock copolymer blend to the substrate; optionally, baking the film at 70 to 150° C. for a period of $\geq 10$ seconds (preferably 10 seconds to 5 minutes); annealing the film; exposing the annealed film to UV radiation to decompose the poly(methyl methacrylate) domains in the annealed film, providing a UV exposed film; and, treating the UV exposed film to remove the decomposed poly(methyl methacrylate) domains, providing a product film.

Substrates used in the method of the present invention include any substrate having a surface that can be coated with a diblock copolymer blend of the present invention. Preferred substrates include layered substrates. Preferred substrates include silicon containing substrates (e.g., glass; silicon dioxide; silicon nitride; silicon oxynitride; silicon containing semiconductor substrates such as silicon wafers, silicon wafer fragments, silicon on insulator substrates, silicon on sapphire substrates, epitaxial layers of silicon on a base semiconductor foundation, silicon-germanium substrates); plastic; metals (e.g., copper, ruthenium, gold, platinum, aluminum, titanium and alloys); titanium nitride; and non-silicon containing semiconductive substrates (e.g., non-silicon containing wafer fragments, non-silicon containing wafers, germanium, gallium arsenide and indium phosphide). Most preferred substrates are silicon containing substrates.

Optionally, the surface of the substrate to be coated with the diblock copolymer blend of the present invention is pretreated with an interposing material before the diblock copolymer blend of the present invention is applied. Preferably, the pretreatment material acts like a tying layer interposed between the surface of the substrate and the diblock copolymer blend material to enhance the adhesion between the diblock copolymer blend material and the substrate. Preferably, the interposing material forms a layer selected from an imaging layer and an orientation control layer.

Imaging layers suitable for use in the method of the present invention include, for example, any type of material that can be patterned or selectively activated. Such materials include, for example, polymer brushes and a self-assembled monolayers of silane and siloxane compounds.

Orientation control layers suitable for use in the method of the present invention include neutral and non-neutral orientation control layers. That is, the orientation control layer can form an interface between the surface of the substrate and the diblock copolymer blend material of the present invention that is preferentially wetted by one of poly(styrene) or poly (methyl methacrylate)—i.e., a non-neutral orientation control layer. A neutral orientation control layer refers to a layer that forms an interface between the surface of the substrate and the diblock copolymer blend material of the present invention that is equally wetted by both poly(styrene) and poly(methyl methacrylate). Neutral orientation control layers preferably include films prepared by casting a random copolymer that comprises residues of both styrene monomers and methyl methacrylate monomers (e.g., poly(styrene-r-methyl methacrylate)-OH).

Preferably, the pretreatment of the substrate before depositing the diblock copolymer blend of the present invention is performed to facilitate the guided self assembly of the diblock copolymer blend material. Specifically, the pretreatment can facilitate one of the two conventional methods used for guided self assembly of diblock copolymer films, namely graphoepitaxy and chemical epitaxy. In the graphoepitaxy, the surface of the substrate is prepatterned with topographical features on the surface of substrate (e.g., trenches, holes) that operate to direct the self organization of the blocks in the ordered diblock copolymer in the diblock copolymer blend.

In the chemical epitaxy, the surface of the substrate is treated with film that exhibits a compositional pattern, wherein the affinity between the various parts of the compositional pattern is different for poly(styrene) and poly(methyl methacrylate). This chemical affinity difference operates to facilitate the directed self assembly of the diblock copolymer blend.

Preferably, the interposing layer is formed on the substrate using a method selected from spin coating, dip coating, roll coating, spray coating and laminating (most preferably spin coating). After application of the interposing layer forming material onto the surface of the substrate, the material is optionally further processed to remove any residual solvent. Preferably, the interposing layer is baked at an elevated temperature (e.g., 70 to 340° C.) for at least 10 seconds to 5 minutes to remove any residual solvent from the interposing layer. Preferably, the baked interposing layer is rinsed with a solvent capable of removing any residual unbound interposing layer material from the surface of the substrate and then rebaked at an elevated temperature (e.g., 70 to 340° C.) for at least 10 seconds to 5 minutes to remove any residual solvent.

Applying a film of the diblock copolymer blend to the substrate in the method of the present invention preferably comprises depositing the diblock copolymer blend onto the substrate using a method selected from spin coating, dip coating, roll coating, spray coating and laminating (most preferably spin coating). After application of the diblock copolymer blend to the substrate, the deposited diblock copolymer blend is optionally further processed to remove any residual solvent. Preferably, the deposited diblock copolymer blend material is baked at an elevated temperature (e.g., 70 to 340° C.) for at least 10 seconds to 5 minutes to remove any residual solvent from the diblock copolymer blend layer.

Annealing of the deposited diblock copolymer blend film can be done by any annealing technique, for example, thermal annealing, thermal gradient annealing, solvent vapor annealing and combinations thereof. Preferably, the film is annealed using a thermal annealing technique. More preferably, the film is annealed using a thermal annealing technique, wherein the deposited film is heated at a temperature of 150 to 340° C. (more preferably 175 to 250° C.; still more preferably 200 to 250° C.; most preferably 220 to 230° C.) for a period of 0.5 minute to 2 days (more preferably 0.5 minute to 2 hours; still more preferably 0.5 minute to 0.5 hour; most preferably 0.5 minute to 5 minutes). Most preferably, the film is annealed in an oxygen free atmosphere (i.e., $[O_2]$<5 ppm).

In the method of the present invention, the annealed film is treated to remove the poly(methyl methacrylate), providing a product film with a plurality of perpendicular, cylindrical holes. Preferably, wherein the plurality of perpendicular, cylindrical holes permeate through the full thickness of the treated film. The treatment comprises: exposing the film to conditions that exhibit differential reactivity towards the poly(methyl methacrylate) in the film relative to the poly(styrene), to facilitate removal of the poly(methyl methacrylate) domains from the annealed film without affecting the poly(styrene) domains. Preferably, the treatment comprises at least one of (a) exposing the annealed film to UV light followed by an active rinse (preferably an acetic acid rinse) to remove the poly(methyl methacrylate); and, (b) exposing the annealed film to a reactive plasma or a reactive ion etching atmosphere to remove the poly(methyl methacrylate). More preferably, the treatment comprises: exposing the annealed film to UV light (preferably a mercury lamp); and then contacting the UV exposed film with acetic acid. Most preferably, the treatment comprises: exposing the annealed film to a reactive ion etching atmosphere, wherein the atmosphere comprises a plasma composed of a low pressure ionized oxidizing gas (preferably $O_2$).

In the method of the present invention, the product film formed on the substrate preferably exhibits a degree of perpendicular, cylindrical hole orientation, $D_{perp}$, of $\geq 0.95$ to 1 (preferably $\geq 98$ to 1), wherein $D_{perp}$ is calculated using the method described in the Examples. More preferably, the product film formed on the substrate exhibits a degree of perpendicular, cylindrical hole orientation, $D_{perp}$, of $\geq 0.95$ to 1 (most preferably $\geq 98$ to 1); and an average film thickness of 0.3 to 10 $L_0$ (preferably 0.5 $L_0$ to 2 $L_0$; most preferably 1.5 $L_0$ to 2 $L_0$); wherein $D_{perp}$ is calculated using the method described in the Examples; wherein the average film thickness is measured using the method described in the Examples; and, wherein $L_0$ is calculated/measured using the method described in the Examples.

Some embodiments of the present invention will now be described in detail in the following Examples.

The following materials were passed through a column packed with activated A-2 grade alumina before being used in the Examples herein, namely tetrahydrofuran (99.9% pure available from Aldrich), styrene (available from Aldrich), and cyclohexane (HPCL grade available from Fischer). The following materials were passed through a column packed with basic alumina before being used in the Examples herein, namely 1,1-diphenylethylene (available from Aldrich), methyl methacrylate (MMA), and hydroxyethyl methacrylate (HEMA). All the other materials used in the Examples herein were commercial materials that were used as received.

The film thicknesses reported in the Examples herein were measured using a JA Woollam ESM 300 ellipsometer in combination with CompleteEASE (version 4.30) software. Thickness data was collected at three different incident angles: 65, 70 and 75° with a wavelength range of 370.0 to 900.0 nm. All of the films tested for thickness were modeled as non-absorbing Cauchy films. Brush layer thickness deposited on the substrate was measured before coating the diblock copolymer or diblock copolymer blend material. The diblock copolymer or diblock copolymer blend film thickness was measured using a two-layer model (diblock copolymer or diblock copolymer blend on top of the brush) in which the brush layer thickness was fixed to the previously measured value.

The number average molecular weight, $M_N$, and weight average molecular weight, $M_w$, values reported in the Examples were measured by gel permeation chromatography (GPC) on an Agilent 1100 series LC system equipped with an Agilent 1100 series refractive index and MiniDAWN light scattering detector (Wyatt Technology Co.). Samples were dissolved in HPCL grade THF at a concentration of approximately 1 mg/mL and filtered through at 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Proton nuclear magnetic resonance ($^1$H NMR) spectroscopy results referred to in the Examples was done on a Varian INOVA 400 MHz NMR spectrometer. Deuterated chloroform was used. A delay time of 10 seconds was used to ensure complete relaxation of protons for quantitative integrations. Chemical shifts are reported relative to tetramethylsilane.

Carbon nuclear magnetic resonance ($^{13}$C NMR) spectroscopy results referred to in the Examples was done on a Bruker Avance 400 MHz NMR spectrometer with inverse-gated proton decoupling. Deuterated chloroform containing 0.02 M chromium(III) acetylacetonate was used. A delay time of 5 seconds was used to ensure complete relaxation of protons for quantitative integrations. Chemical shifts are reported relative to tetramethysilane.

Example 1

Preparation Ordered PS-b-PMMA Diblock Copolymer

Into a 1 L 3-neck round bottomed reactor under an argon atmosphere, 326 g of tetrahydrofuran ("THF") was transferred. The contents of the reactor were then cooled to −78° C. The THF in the reactor was then titrated with a 0.36 M solution of sec-butyllithium in cyclohexane until the contents of the reactor exhibited a persistent pale yellow color. The contents of the reactor were then warmed to 30° C. and were maintained at that temperature until the color completely disappeared (approximately 10-15 minutes). Styrene (18.80 g) was then transferred via cannula to the reactor under an argon atmosphere. The contents of the reactor were then cooled to −78° C. A solution of 0.65 M sec-butyllithium in cyclohexane (4.09 g) was then rapidly added to the reactor via cannula. The color of the reactor contents were observed to turn a dark yellow. The resulting exotherm caused the reactor contents to exhibit a 10-15° C. temperature rise within 1 minute of the addition of the sec-butyllithium solution. The contents of the reactor then cooled back down to −78° C. over the following 10 minutes. The contents of the reactor were stirred for an additional 10 minutes. Then a small portion of the reactor contents was withdrawn for gel permeation chromatography analysis of the polystyrene block formed. 1,1-diphenylethylene (0.0715 g) diluted in 4.09 g of cyclohexane was then transferred to the reactor via cannula, causing the contents of the reactor to turn from a dark yellow to a dark ruby red. The contents of the reactor were then stirred for 30 minutes at −78° C. Methyl methacrylate ("MMA") (6.7710 g) diluted in cyclohexane (7.7820 g) was then transferred into the reactor via cannula. The resulting exotherm caused the reactor contents to warm to −72° C. within 4 minutes of the MMA addition before cooling back down to −76° C. The reactor contents were stirred for an additional 30 minutes. The reaction in the reactor was then quenched via the addition of anhydrous methanol to the reactor. The reactor contents were then precipitated into 1 L of methanol and the solids were collected by vacuum filtration. The resulting filter cake was then dissolved in 150 mL of dichloromethane and washed twice with 100 mL of deionized water. The solution was then transferred into 1 L of methanol and the precipitated solids were collected by vacuum filtration and dried in a vacuum oven at 60° C. overnight to provide the product poly(styrene)-b-poly(methyl methacrylate) diblock copolymer ("$BCP_x$"). The product diblock copolymer, $BCP_x$, was determined to exhibit a $M_N$=78.0 kg/mol; a $M_W$=85.8 kg/mol; a $M_W/M_N$=1.10; and a $Wf_{BCPx\text{-}PS}$=77.1 wt %. The $\chi N_{BCPx}$ value for $BCP_x$ was calculated to be 28.2.

Example 2

Preparation Ordered PS-b-PMMA Diblock Copolymer

Into a 1 L 3-neck round bottomed reactor under an argon atmosphere, 342 g of tetrahydrofuran ("THF") was transferred. The contents of the reactor were then cooled to −78° C. The THF in the reactor was then titrated with a 0.36 M solution of sec-butyllithium in cyclohexane until the contents of the reactor exhibited a persistent pale yellow color. The contents of the reactor were then warmed to 30° C. and were maintained at that temperature until the color completely disappeared (approximately 10-15 minutes). Styrene (18.44 g) was then transferred via cannula to the reactor under an argon atmosphere. The contents of the reactor were then cooled to −78° C. A solution of 0.65 M sec-butyllithium in cyclohexane (3.87 g) was then rapidly added to the reactor via cannula. The color of the reactor contents were observed to turn a dark yellow. The resulting exotherm caused the reactor contents to exhibit a 10-15° C. temperature rise within 1 minute of the addition of the sec-butyllithium solution. The contents of the reactor then cooled back down to −78° C. over the following 10 minutes. The reactor contents were stirred for an additional 10 minutes. A small portion of reactor contents was then withdrawn from the reactor for gel permeation chromatography analysis of the polystyrene block formed. 1,1-diphenylethylene (0.074 g) diluted in 2.9 g of cyclohexane was then transferred to the reactor via cannula, causing the reactor contents to turn from a dark yellow to a dark ruby red. The contents of the reactor were then stirred for 20 minutes at −78° C. Methyl methacrylate ("MMA") (6.7042 g) diluted in cyclohexane (7.877 g) was then transferred into the reactor via cannula. The resulting exotherm caused the reactor contents to warm to −71° C. within 4 minutes of the MMA addition before cooling back down to −75° C. The reactor contents were stirred for an additional 30 minutes. The reaction in the reactor was then quenched via the addition of anhydrous methanol to the reactor. The reactor contents were then precipitated into 1 L of methanol and the solids were collected by vacuum filtration. The resulting filter cake was then dissolved in 150 mL of dichloromethane and washed twice with 100 mL of deionized water. The solution was then transferred into 1 L of methanol and the precipitated solids were collected by vacuum filtration and dried in a vacuum oven at 60° C. overnight to provide the product poly(styrene)-b-poly(methyl methacrylate) diblock copolymer, $BCP_y$. The product diblock copolymer, $BCP_y$, was determined to exhibit a $M_N$=78.6 kg/mol; a $M_W$=84.9 kg/mol; $M_W/M_N$=1.08; and a $Wf_{BCPy\text{-}PS}$ of 76.8 wt %. The $\chi N_{BCPy}$ value for BCP was calculated to be 28.4.

Example 3

Preparation Disordered PS-b-PMMA Diblock Copolymer

Into a 1 L 3-neck round bottomed reactor under an argon atmosphere, 326 g of tetrahydrofuran ("THF") was transferred. The contents of the reactor were then cooled to −78° C. The THF in the reactor was then titrated with a 0.36 M solution of sec-butyllithium in cyclohexane until the contents of the reactor exhibited a persistent pale yellow color. The contents of the reactor were then cooled to −78° C. The THF in the reactor was then titrated with a 0.36 M solution of sec-butyllithium in cyclohexane until the contents of the reactor exhibited a persistent pale yellow color. The contents of the reactor were then warmed to 30° C. and were maintained at that temperature until the color completely disappeared (approximately 10-15 minutes). Styrene (18.8 g) was then transferred via cannula to the reactor under an argon atmosphere. The contents of the reactor were then cooled to −78° C. A solution of 0.65 M sec-butyllithium in cyclohexane (3.87 g) was then rapidly added to the reactor via cannula. The color of the reactor contents were observed to turn a dark yellow. The resulting exotherm caused the reactor contents to exhibit a 10-15° C. temperature rise within 1 minute of the addition of the sec-butyllithium solution. The contents of the reactor then cooled back down to −78° C. over the following 10 minutes. The reactor contents were stirred for an additional 20 minutes. A small portion of reactor contents was then withdrawn from the reactor for gel permeation chromatography analysis of the polystyrene block formed. 1,1-diphenylethylene (0.2296 g) diluted in 2.92 g of cyclohexane was then transferred to the reactor via cannula, causing the reactor contents to turn from a dark yellow to a dark ruby red. The contents of the reactor were then stirred for 10 minutes at −78° C. Methyl methacrylate ("MMA") (9.31 g) diluted in cyclohexane (9.33 g) was then transferred via cannula into the reactor. The resulting exotherm caused the reactor contents to warm to −65° C. within 4 minutes of the MMA addition before cooling back down to −74° C. The reactor contents were stirred for an additional 75 minutes. The reaction in the reactor was then quenched via the addition of anhydrous methanol to the reactor. The reactor contents were then precipitated into 1 L of methanol and the solids were collected by vacuum filtration. The resulting filter cake was then dissolved in 150 mL of dichloromethane and washed twice with 100 mL of deionized water. The solution was then transferred into 1 L of methanol and the precipitated solids were collected by vacuum filtration and dried in a vacuum oven at 60° C. overnight to provide the product poly(styrene)-b-poly(methyl methacrylate) diblock copolymer, $BCP_z$. The product diblock copolymer, $BCP_z$, was determined to have a $M_N$=21.2 kg/mol; a $M_W$=22.9 kg/mol; a $M_W/M_N$=1.08; and a $Wf_{BCPz-PS}$ of 68.7 wt %. The calculated $\chi N_{BCPz}$ value for $BCP_z$ was calculated to be 7.7.

Example 4

PS-b-PMMA Diblock Copolymer Filtering

Each of the PS-b-PMMA diblock copolymers prepared according to Example 1-3 was added to toluene to form a 2.0 wt % solution. The 2.0 wt % solutions formed were then separately hand filtered through a 0.2 μm Whatman syringe filter. The product filtrate material was collected for further use.

Example 5

Preparation of Diblock Copolymer Blend

The product filtrate of Example 4 obtained from the PS-b-PMMA diblock copolymer of Example 1, $BCP_x$, and the product filtrate of Example 4 obtained from the PS-b-PMMA diblock copolymer of Example 3, $BCP_z$, were combined to form a PS-b-PMMA diblock copolymer blend solution having a weight ratio of $BCP_x$ to $BCP_z$ of 8:2. The PS-b-PMMA diblock copolymer blend solution was further diluted with toluene to provide the product casting solution having the desired wt % solids.

Example 6

Preparation of Diblock Copolymer Blend

The product filtrate of Example 4 obtained from the PS-b-PMMA diblock copolymer of Example 2, $BCP_y$, and the product filtrate of Example 4 obtained from the PS-b-PMMA diblock copolymer of Example 3, $BCP_z$, were combined to form a PS-b-PMMA diblock copolymer blend solution having a weight ratio of $BCP_y$ to $BCP_z$ of 8:2. The PS-b-PMMA diblock copolymer blend solution was further diluted with toluene to provide the product casting solution having the desired wt % solids.

Example 7

Preparation of Initiator

The following components were combined in a 3 neck round bottom flask: 13.8 g of 2,2,6,6-tetramethyl-1-piperidinyloxy ("TEMPO"); 10.0 mL 1-bromoethyl benzene; 4.8 g copper powder; 0.26 g copper(II) trifluoromethanesulfonate ("Cu(Otf)$_2$"); 0.80 g di-tert-butyl bipyridine ("dtbpy"); and, 100 mL of benzene. The contents of the flask were then degassed and placed under a dry nitrogen atmosphere. The contents of the flask were then heated and maintained at 75° C. for 6 hours. The temperature of the flask contents was then reduced to 60° C. and the contents were allowed to react overnight. The flask contents were observed to undergo a color change from a dark orange-brown to a tan color after which a tan precipitate formed. The flask contents were then filtered to remove copper salts and then stripped of solvent, leaving a residual orange oil. White crystals formed in the residual oil upon standing. The residual oil was then placed in a refrigerator and additional crystals formed. The crystalline product was added to methanol, filtered, recrystallized and dried to yield 15.7 g of initiator product. The initiator product was characterized using $^1$H an $^{13}$C NMR to be 2,2,6,6-tetramethyl-1-(1-(phenylethoxy)piperidine ("PDH2").

Example 8

Preparation of Random Copolymer Brush

The following materials were loaded into a 100 mL Schlenk flask: 0.0563 g of initiator PDH2 prepared according Example 7; 15 g styrene; 6.29 g methyl methacrylate; 0.27 g hydroxy ethyl methacrylate; and, a magnetic stir bar. The contents of the flask were deoxygenated by nitrogen gas for 1 hour. The flask was then placed in an oil bath set at 120° C. for 42 hours. The flask was then cooled in ice and 70 mL of methylene chloride was added to the contents of the flask to dissolve the polymer. The contents of the flask were then poured into 1 L of methanol to precipitate the polymer. The polymer precipitate was then filtered out, redissolved into 60 mL of methylene chloride and precipitated again into 1 L of methanol. The product copolymer brush was collected from the methanol via vacuum filtration and was dried in a vacuum oven at 50° C. overnight. The product copolymer brush exhibited a number average molecular weight, $M_N$, of 39.8 kg/mol and a composition determined by $^{13}$C NMR of 67.5 mol % styrene derived units; 31.2 mol % methyl methacrylate derived units and 1.3 mol % hydroxy ethyl methacrylate derived units.

Example 9

Substrate Preparation

A 1"×1" substrate was cut out of 4" diameter standard silicon wafer (Item Number 2041, purchased from Silicon Quest International Inc., of Santa Clara, Calif.). The 1"×1" substrate was then cleaned by rinsing in a 3.7 wt % hydrochloric acid bath for 4 hours. After cleaning, the 1"×1" substrate was stored in a methanol bath prior to use. The 1"×1" substrate was then removed from the methanol bath and blown dry using nitrogen.

The random copolymer brush prepared according to Example 8 was then mixed with toluene to provide a 0.5 wt % (solids) random copolymer brush solution. The random copolymer brush solution was then spin coated at 3,000 rpm onto the substrate. The substrate was then annealed at 180° C. for 60 minutes in an oven under nitrogen (containing <4 ppm oxygen) to facilitate covalent linkage of the random copolymer brush to the substrate via dehydration reaction between the hydroxyl groups on the substrate surface and the hydroxyl groups in the HEMA segments of the random copolymer brush. The substrate was then washed with toluene to remove any unbound random copolymer brush material.

Example 10

Film Deposition

A 1.6 wt % (solids basis) solution of the diblock copolymer blend prepared according to Example 5 was then spin coated at 2,000 rpm onto a substrate prepared according to Example 9 over the deposited random copolymer brush to yield a 67.3 nm thick film of the deposited diblock copolymer blend. The deposited film was then annealed in an oven at 225° C. for 60 minutes under nitrogen atmosphere (containing <4 ppm oxygen).

Comparative Example C1

Film Deposition

A 1.6 wt % (solids basis) solution of the product filtrate of Example 4 obtained from the PS-b-PMMA diblock copolymer of Example 1, $BCP_x$, was then spin coated at 2,000 rpm onto a substrate prepared according to Example 9 over the deposited random copolymer brush to yield a 66.7 nm thick film of the deposited diblock copolymer, $BCP_x$. The deposited film was then annealed in an oven at 225° C. for 60 minutes under nitrogen atmosphere (containing <4 ppm oxygen).

Examples 11-14

Film Deposition

In each of Examples 11-14 a solution containing the diblock copolymer blend prepared according to Example 5 was spin coated onto a substrate prepared according to Example 9 over the deposited random copolymer brush. In Example 11, the solution concentration and spin speed were selected to yield a 33.6 nm thick film of the deposited diblock copolymer blend. In Example 12, the solution concentration and spin speed were selected to yield a 38.1 nm thick film of the deposited diblock copolymer blend. In Example 13, the solution concentration and spin speed were selected to yield a 42.0 nm thick film of the deposited diblock copolymer blend. In Example 14, the solution concentration and spin speed were selected to yield a 45.3 nm thick film of the deposited diblock copolymer blend. Each of the deposited films were then annealed in an oven at 225° C. for 60 minutes under nitrogen atmosphere (containing <4 ppm oxygen).

Comparative Example C2-5

Film Deposition

In each of Comparative Examples C2-5 a solution of the product filtrate of Example 4 obtained from the PS-b-PMMA diblock copolymer of Example 1, $BCP_x$, was spin coated onto a substrate prepared according to Example 9 over the deposited random copolymer brush. In Comparative Example C2, the solution concentration and spin speed were selected to yield a 33.4 nm thick film. In Comparative Example C3, the solution concentration and spin speed were selected to yield a 37.4 nm thick film. In Comparative Example C4, the solution concentration and spin speed were selected to yield a 41.8 nm thick film. In Comparative Example C5, the solution concentration and spin speed were selected to yield a 45.1 nm thick film. Each of the deposited films were then annealed in an oven at 225° C. for 60 minutes under nitrogen atmosphere (containing <4 ppm oxygen).

Deposited Film Treatment and Analysis

The film deposited in each of Examples 10-14 and in Comparative Examples C1-C5 was then exposed to a 20 J/cm² dose of UV radiation from a mercury lamp. The films were then submerged in glacial acetic acid for 20 minutes. The films were then washed in distilled water and blown dry with nitrogen.

The product films from Examples 10-14 and Comparative Example C1-C5 following UV exposure and acid treatment were then examined by Scanning Electron Microscopy using a Hitachi S-4500 scanning electron microscope (SEM) with a secondary electron detector. The test samples were mounted on the SEM stage using double sided carbon tape and cleaned by blowing nitrogen prior to analysis. Images of the test samples were collected at 50,000× magnification and working distances between 4 and 8. Top down image of the product films from Examples 10-14 and Comparative Example C1-C5 following UV exposure and acid treatment are provided in FIGS. 1-10, respectively. The darker regions are areas that were occupied by poly(methyl methacrylate) domains prior to UV exposure and acid treatment.

The inter cylinder spacings (or film "Pitch"), $L_0$, for the films reported in TABLE 1 were measured using image analysis of the SEMs of the films with SPIP 5.1.5 software. First, a region of the film in each SEM having a large grain of perpendicularly oriented cylindrical holes including at least 100 holes was selected. The Pitch for the film was then determined from the selected region by taking 2-D Fast Fourier Transform (FFT). All the SEMs observed were found to exhibit the signature FFT pattern of a hexagonally close packed (HCP) array, whose innermost ring comprises a set of six spots which lie on the vertices of a hexagon. The distance of each spot from the center the pattern (referred to as the $d_{100}$ spacing) was measured. The Pitch of the films reported in TABLE 1 was then calculated from the average of the measured $d_{100}$ spacings for that film, $d_{avg}$, using the following expression:

$$L_0 = \left[d_{avg}\left(\frac{2}{\sqrt{3}}\right)\right].$$

Analysis of the SEM images in FIGS. 1-10 was carried out using ImageJ 1.45d software. As a first step of the analysis, regions in the images occupied by poly(methyl methacrylate) domains prior to UV exposure and acid treatment were isolated. This was done by applying the "Smooth" process followed by "Default" thresholding based on pixel gray-scale value. In some cases the inherent contrast of the image was too low to resolve the voids previously occupied by poly (methyl methacrylate) domains. When they were processed as described above, distinct voids formed from the removal of the poly(methyl methacrylate) domains that merged together to form aggregates in some regions. To avoid this problem, only voids within the size range of 100-400 nm² (in a plane parallel with the surface of the substrate) were selected from such images. This procedure yielded isolated voids with a varying degree of circularity; those voids with a high degree of circularity corresponded to poly(methyl methacrylate) cylinders that were oriented perpendicular to the surface of the substrate before UV exposure and acid treatment and those voids with a low degree of circularity corresponded to poly (methyl methacrylate) cylinders that were parallel to the surface of the substrate before UV exposure and acid treatment. The total void area, $A_{PMMA\text{-}total}$, was calculated by summing up the areas of the individual voids. Next, amongst the voids, those having a high degree of circularity (between 0.75-1.00) were further isolated using standard options in the software. The area occupied by these features, $A_{PMMA\text{-}perp}$ was then calculated. The degree of perpendicular, cylindrical hole orientation, $D_{perp}$, in the image was then calculated from $A_{PMMA\text{-}total}$ and $A_{PMMA\text{-}perp}$ using the following equation:

$$D_{perp} = [(A_{PMMA\text{-}perp}) \div (A_{PMMA\text{-}total})].$$

Figure 2:
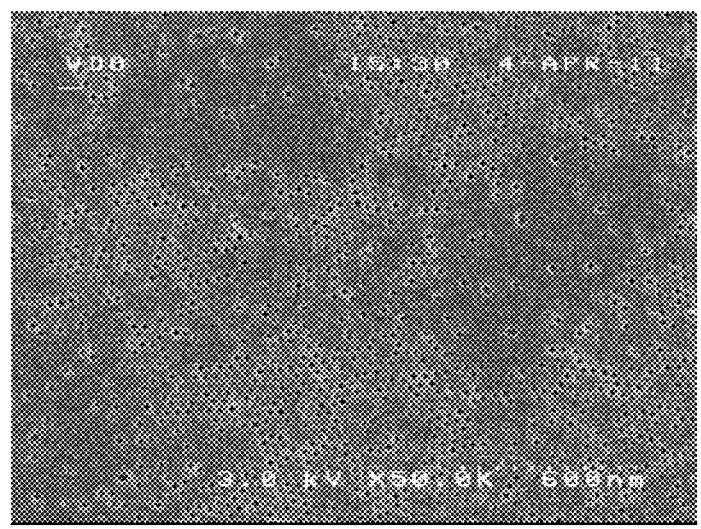
FIG. 2 is a depiction of a top down SEM image of the product film prepared according to Example 11.
Figure 4:
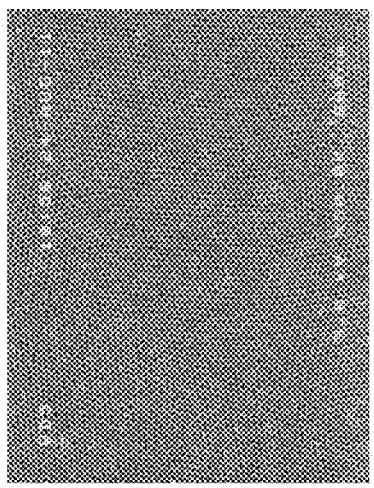
FIG. 4 is a depiction of a top down SEM image of the product film prepared according to Example 13.
Figure 6:
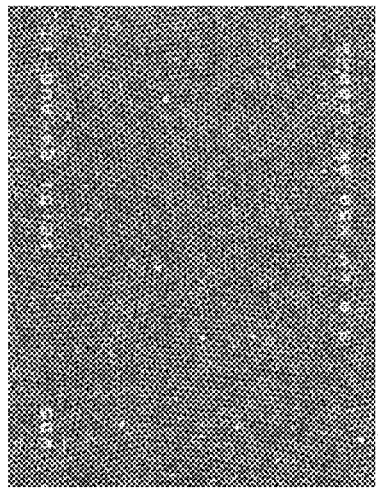
FIG. 6 is a depiction of a top down SEM image of the product film prepared according to Comparative Example C1.
Figure 3:
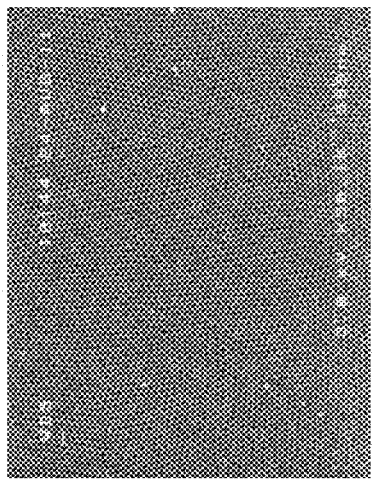
FIG. 3 is a depiction of a top down SEM image of the product film prepared according to Example 12.
Figure 5:
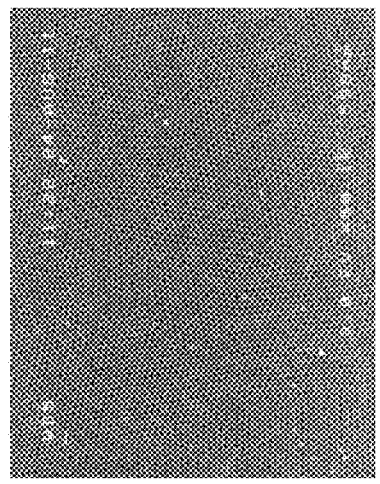
FIG. 5 is a depiction of a top down SEM image of the product film prepared according to Example 14.
Figure 8:
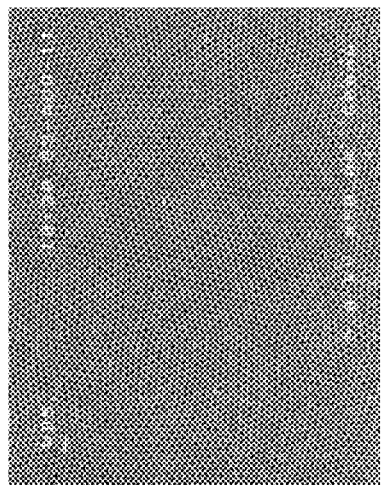
FIG. 8 is a depiction of a top down SEM image of the product film prepared according to Comparative Example C3.
Figure 10:
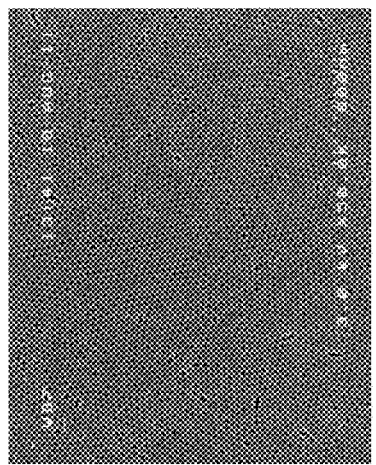
FIG. 10 is a depiction of a top down SEM image of the product film prepared according to Comparative Example C5.
Figure 7:
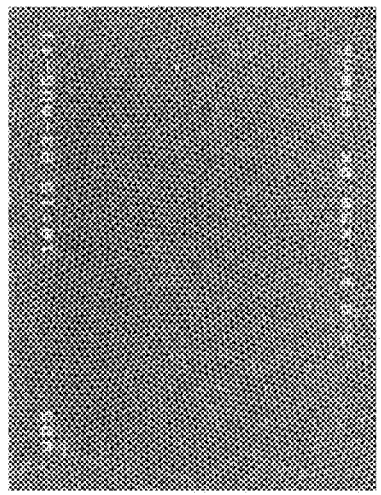
FIG. 7 is a depiction of a top down SEM image of the product film prepared according to Comparative Example C2.
Figure 9:
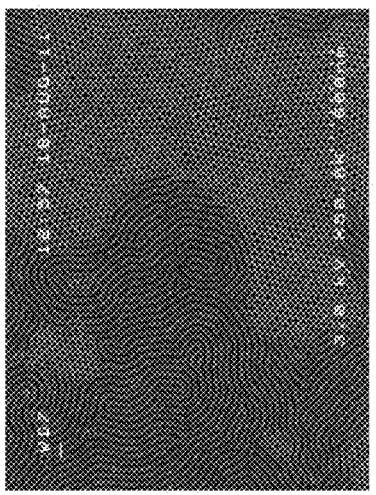
FIG. 9 is a depiction of a top down SEM image of the product film prepared according to Comparative Example C4.

Upon analysis of FIGS. 1 and 2, the darker regions are voids in the deposited films that were occupied by poly(methyl methacrylate) domains before the UV exposure and acid treatment. In both of FIGS. 1 and 2 these darker regions appear as circular features consistent with cross sections of poly(methyl methacrylate) cylinders that were aligned perpendicular to the surface of the substrate before UV exposure and acid treatment and which permeated through the thickness of the film. Notwithstanding, these darker regions cover approximately 26% of the total area of the deposited film from Example 10 and only about 5% of the total area of the deposited film from Comparative Example C1. The volume fraction of poly(methyl methacrylate) present in the PS-b-PMMA diblock copolymer blend used in the film deposited in Example 10 was 24.6 vol %. The volume fraction of poly (methyl methacrylate) present in the PS-b-PMMA diblock copolymer used in film deposited in Example C1 was 22.9 vol %. While essentially 100% of poly(methyl methacrylate) in the PS-b-PMMA diblock copolymer blend used in the film deposited in Example 10 formed voids (i.e., cylindrical holes) that were aligned perpendicular to the surface of the substrate; more than 80% of poly(methyl methacrylate) in the PS-b-PMMA diblock copolymer used in the film deposited in Comparative Example C1 formed voids that lie parallel to the surface of the substrate and buried under a layer of polystyrene.

The degree of perpendicular, cylindrical hole orientation, $D_{perp}$, was determined for each of the films prepared according to Examples 11-14 and Comparative Examples C2-C5. The values of $D_{perp}$ determined for these films are reported in TABLE 1.

TABLE 1

| Ex. # | Film Thickness (in nm) | $L_0$ (in nm) | $D_{perp}$ |
|---|---|---|---|
| 11 | 33.6 | 38.6 | 0.99 |
| 12 | 38.1 | 38.6 | 0.98 |
| 13 | 42.0 | 38.6 | 0.98 |
| 14 | 45.3 | 38.6 | 0.98 |
| C2 | 33.4 | 36.4 | 0.97 |
| C3 | 37.4 | 36.4 | 0.99 |
| C4 | 41.8 | 36.4 | 0.31 |
| C5 | 45.1 | 36.4 | 0.89 |

We claim:

1. A diblock copolymer blend, comprising:
    >50 wt % to 99 wt % (on a solids basis) of an ordered poly(styrene)-b-poly(methyl methacrylate) diblock copolymer, BCP1, having a polystyrene volume fraction, $Vf_{BCP1-PS}$, of 0.65 to 0.87; and, wherein the following expression is true $$\chi N_{BCP1} > \left[ \frac{1.6}{Vf_{BCP1-PS} * (1 - VF_{BCP1-PS}) - 0.098} \right]$$

wherein $\chi N_{BCP1}$ is the product of the Flory-Huggins interaction parameter, $\chi_{BCP1}$, of BCP1 at 225° C. and the degree of polymerization, $N_{BCP1}$, of BCP1;
and,
    1 to <50 wt % (on a solids basis) of a disordered poly (styrene)-b-poly(methyl methacrylate) diblock copolymer, BCP2, having a polystyrene volume fraction, $Vf_{BCP2-PS}$, of 0.5 to 0.99; and, wherein the following expression is true $$\chi N_{BCP2} < \left[ \frac{2.6}{Vf_{BCP2-PS} * (1 - VF_{BCP2-PS})} \right]$$

wherein $\chi N_{BCP2}$ is the product of the Flory-Huggins interaction parameter, $\chi_{BCP2}$, of BCP2 at 225° C. and the degree of polymerization, $N_{BCP2}$, of BCP2;
    wherein the number average molecular weight of BCP1, $M_{N-BCP1}$, is 30 to 500 kg/mol;
    wherein the number average molecular weight of BCP2, $M_{N-BCP2}$ is 0.1 to <500 kg/mol; and,
    wherein $M_{N-BCP1} > M_{N-BCP2}$.

2. The diblock copolymer blend of claim 1, wherein the BCP1 exhibits a number average molecular weight, $M_{N-BCP1}$, of 30 to 500 kg/mol with a polydispersity, $PD_{BCP1}$, of 1 to 2.

3. The diblock copolymer blend of claim 1, wherein the BCP2 exhibits a number average molecular weight, $M_{N-BCP2}$, of 0.1 to <500 kg/mol with a polydispersity, $PD_{BCP2}$, of 1 to 2.

4. The diblock copolymer blend of claim 1,
    wherein the BCP1 exhibits a number average molecular weight, $M_{N-BCP1}$, of 30 to 500 kg/mol with a polydispersity, $PD_{BCP1}$, of 1 to 2; and,
    wherein the BCP2 exhibits a number average molecular weight, $M_{N-BCP2}$, of 0.1 to <500 kg/mol with a polydispersity, $PD_{BCP2}$, of 1 to 2.

5. The diblock copolymer blend of claim 1, wherein the following equation is satisfied:

$$0.20 \geq \left| \frac{Vf_{BCP1-PS} - Vf_{BCP2-PS}}{Vf_{BCP1-PS}} \right|.$$

6. The diblock copolymer blend of claim 1, further comprising a solvent; wherein the solvent is selected from the group consisting of propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene.

7. The diblock copolymer blend of claim 1, further comprising an additive; wherein the additive is selected from the group consisting of additional polymers (including homopolymers and random copolymers); surfactants; antioxidants; photoacid generators; thermal acid generators; quenchers; hardeners; adhesion promoters; dissolution rate modifiers; photocuring agents; photosensitizers; acid amplifiers; plasticizers; orientation control agents and cross linking agents.

8. The diblock copolymer blend of claim 1, further comprising an orientation control agent.

9. A method comprising:
    providing a substrate having a surface;
    providing a diblock copolymer blend according to claim 1;
    applying a film of the diblock copolymer blend to the surface of the substrate;
    optionally, baking the film;
    annealing the film;
    treating the annealed film to remove the poly(methyl methacrylate), providing a product film with a plurality of perpendicular, cylindrical holes;
    wherein each of the perpendicular, cylindrical holes exhibit an axis of symmetry that is perpendicular to the surface of the substrate.

10. The method of claim 9, wherein the product film exhibits a degree of perpendicular, cylindrical hole orientation, $D_{perp}$, of ≧0.95 to 1.

* * * * *